United States Patent [19]

Choi

[11] Patent Number: 5,130,772
[45] Date of Patent: Jul. 14, 1992

[54] THIN FILM TRANSISTOR WITH A THIN LAYER OF SILICON NITRIDE

[75] Inventor: Kwangsoo Choi, Suwon, Rep. of Korea

[73] Assignee: Samsung Electron Devices Co., Ltd., Hwasung, Rep. of Korea

[21] Appl. No.: 690,529

[22] Filed: Apr. 23, 1991

Related U.S. Application Data

[63] Continuation-in-part of Ser. No. 451,292, Dec. 15, 1989, abandoned.

[51] Int. Cl.[5] ............ H01L 29/01; H01L 27/12; H01L 45/00; H01L 29/34
[52] U.S. Cl. .................. 357/23.7; 357/4; 357/2; 357/54
[58] Field of Search ............ 357/23.7, 4, 2, 54

[56] References Cited

U.S. PATENT DOCUMENTS 5,032,536 7/1991 Oritsuki et al. ............ 357/23.7

FOREIGN PATENT DOCUMENTS 0114263 3/1990 Japan ............ 357/4
6066860 3/1990 Japan ............ 357/4

OTHER PUBLICATIONS

"Change Trapping Instabilities in Amorphous Silicon-Silicon Nitride Thin-Film Transistors" M. J. Powell, Applied Physics Letters, 43, Sep. 15, 1983, pp. 597-599.
"Semiconductor Devices Physics and Technology", S. M. Sze, Wiley, 1955.

Primary Examiner—Rolf Hille
Assistant Examiner—Wael Fahmy
Attorney, Agent, or Firm—Christie, Parker & Hale

[57] ABSTRACT

There is disclosed a thin film transistor, wherein the lengthwise direction of the source is made parallel to that of the gate, and an insulating layer is continuously deposited between double gates and the semiconductor layer to obstruct the pin holes generated during first deposition. Further, between overlapping semiconductor layers there is interposed an insulating layer to prevent short circuit of the electrodes due to the pin holes in the semiconductor layers.

2 Claims, 2 Drawing Sheets

THIN FILM TRANSISTOR WITH A THIN LAYER OF SILICON NITRIDE

CROSS-REFERENCE TO RELATED APPLICATIONS

This is a continuation-in-part of application Ser. No. 07/451,292, now abandoned, filed Dec. 15, 1989.

BACKGROUND OF THE INVENTION

The present invention concerns a thin film transistor.

Generally, a thin film transistor is used as a switching element for a device such as a plate display, since it realizes low voltage drive, low power consumption, light weight and high quality imaging. Such a thin film transistor will be briefly described with reference to FIGS. 1 and 2.

FIGS. 1 and 2 illustrate respectively a cross section and plan view of the construction of a thin film transistor of the prior art. First a metal thin film of Cr is deposited on a glass substrate A to form gate B, on which are successively deposited gate insulating layer C of an a-Si:N film, semiconductor layer D of an a-Si:H film, and ohmic layer E of n+ a-Si:H film by plasma assisted chemical vapour deposition (PACVD).

Thereafter, the semiconductor layer D of a-Si:H film and the ohmic layer E of n+ a-Si:H film are subjected to photolithographic process to form a pattern, on which are deposited source F and drain G. The source and drain are made of a second metal thin film of Al. Finally, the ohmic layer E of n+ a-Si:H film remaining in the channel between the source and drain is removed by dry etching, thus completing a thin film transistor.

Meanwhile, the etching speed of the gate insulating layer C of a-SiN:H is equal to that of the semiconductor layer D of a-Si:H, so that the gate insulating layer C of a-SiN:H may be etched simultaneously with the ohmic layer E of n+ a-Si:H and semiconductor layer D of a-Si:H being etched. Hence, the gate insulating layer C is exceedingly etched so as to lessen the insulating effect, subsequently causing a short circuit at the crossing of the gate and source leads. Moreover, there are generated pin holes when depositing the semiconductor layer D on the gate insulating layer C, so that the electrodes are short-circuited with each other when using the thin film transistor thus obtained as a switching element. Besides, when the thin film transistor is arrayed, as shown in FIG. 2, to make a display, the gate and source are crossed, thereby causing malfunction.

SUMMARY OF THE INVENTION

The object of the present invention is to provide a thin film transistor wherein the semiconductor layer and gate are formed of multiple layers so as to prevent short circuit due to pin holes. Additionally, to improve yield rates, the lengthwise direction of the gate is parallel to that of the source.

According to the present invention, the lengthwise direction of the source is made parallel to that of the gate. Insulating layer is continuously deposited between double gates and semiconductor layer to obstruct the pin holes generated during first deposition. Between the semiconductor layers is interposed insulating a thin semiconductor layer to prevent short circuit of the electrodes due to the pin holes in the semiconductor layers, and conduct current between the semiconductor layers by tunneling.

DETAILED DESCRIPTION OF THE INVENTION

The present invention will now be described more specifically with reference to the accompanying drawings.

Figure 1:
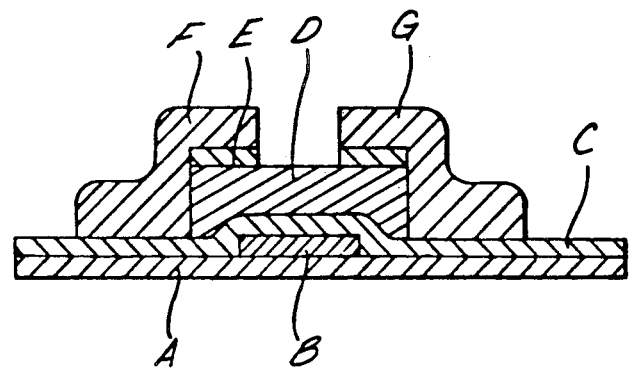
FIG. 1 is a cross section of the thin film transistor of prior art.
Figure 2:
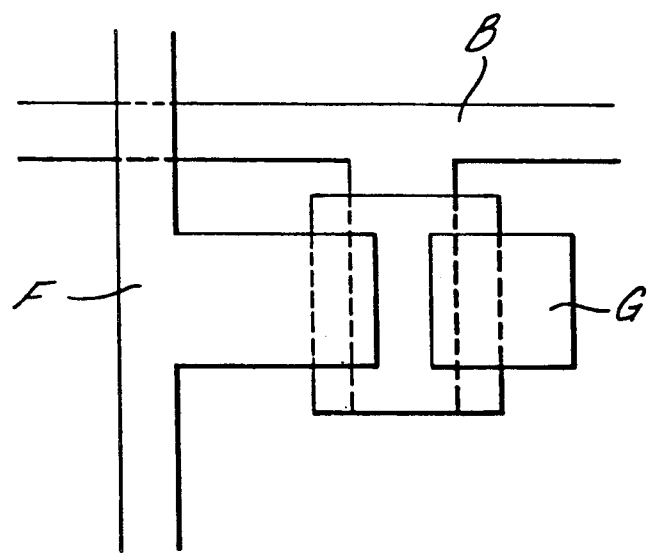
FIG. 2 is a plan view of the thin film transistor of FIG. 1.
Figure 3:
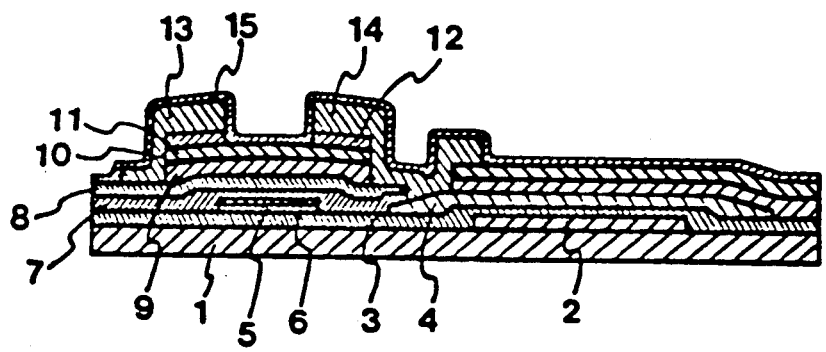
FIG. 3 is a cross section of a thin film transistor according to the present invention.
Figure 4:
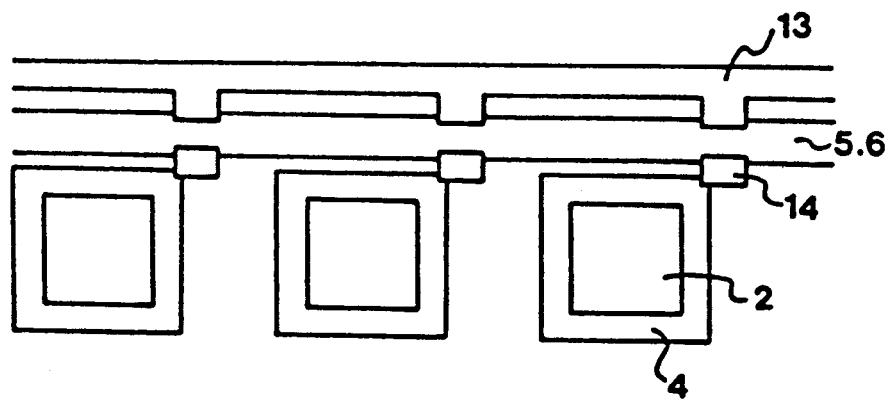
FIG. 4 is a plan view of the inventive thin film transistor arrayed, wherein the gate and source are not crossed.

Referring to FIGS. 3 and 4, a transparent electrode of indium tin oxide (ITO) is deposited on glass substrate 1 on which is formed capacitor electrode 2, then coated with insulating layer 3 of silicon oxide ($SiO_2$) having the thickness of about 3,000 Å. Over the insulating layer 3 are successively deposited ITO and chrome (Cr), which is subjected to photolithographic process to form ITO electrode 5 and gate 6 of double gate construction. On the insulating layer 3 is formed pixel electrode 4, which is made to contact the end of drain 14.

On the gate 6 are formed first and second gate insulating layers 7 and 8 by continuously twice depositing silicon oxide ($SiO_2$), on which is deposited amorphous silicon to a thickness of about 3,000 Å to form first and second semiconductor layers 9 and 11 having respective thicknesses of about 1,500 Angstroms. Between the first and second semiconductor layers is deposited amorphous silicon nitride to form a semiconductive insulating layer 10 having a thickness of several tens of Angstroms, which is sufficiently thin to conduct current. Because of hydrogen codeposited in the silicon nitride, a thin layer is semiconductive due to tunneling. On the second semiconductor layer 11 is deposited n+ amorphous silicon to form ohmic layer 12 by a photolithographic process.

Meanwhile, the n+ amorphous silicon thin film remaining between the source 13 and drain 14 is dry etched, then protected by amorphous silicon nitride coating 15.

The gate 6 and source 13 should be made parallel to each other, so that the are not crossed when arraying the thin film transistor.

Thus, multiple gate insulating layers are continuously deposited between the gate and semiconductor layer, so that there is prevented short circuit of the gate and source due to the pin holes in the gate insulating layer and excessive etching. Moreover, the multiple semiconductor layers also prevent short circuit of the gate, source and drain, thus properly controlling the signal flow.

What is claimed is:

1. A thin film transistor comprising a capacitor electrode formed on a glass substrate, an insulating layer deposited over said capacitor electrode, an indium tin oxide (ITO) electrode formed on said insulating layer, a gate formed on said ITO electrode, first and second gate insulating layers of silicon oxide ($SiO_2$) deposited on said gate, first and second semiconductor layers of amorphous silicon deposited on said insulating layers, with an insulating layer of amorphous silicon nitride sufficiently thin to enable tunneling and interposed between said first and second semiconductor layers, an ohmic layer deposited on said second semiconductor layer, and a source and a drain deposited on said ohmic layer.

2. A thin film transistor as in claim 1 wherein the lengthwise directions of the drain, semiconductor layers, and gate are in parallel with the lengthwise direction of the source.

* * * * *

UNITED STATES PATENT AND TRADEMARK OFFICE
CERTIFICATE OF CORRECTION

PATENT NO. : 5,130,772
DATED : July 14, 1992
INVENTOR(S) : Kwangsoo Choi

It is certified that error appears in the above-indentified patent and that said Letters Patent is hereby corrected as shown below:

On the Title page:

[56] References Cited, OTHER PUBLICATIONS, change the title from "Change Trapping Instabilities in Amorphous Silicon-Silicon Nitride Thin-Film Transistors" to -- "Charge Trapping Instabilities in Amorphous Silicon-Silicon Nitride Thin-Film Transistors --.

Column 1, line 57, change "rates" to -- rate --.

Column 2, line 48, change "the" to -- they --.

Column 4, line 1, change "directions" to -- direction --.

Signed and Sealed this

Fourteenth Day of December, 1993

Attest:

BRUCE LEHMAN

*Attesting Officer*     *Commissioner of Patents and Trademarks*